United States Patent
Qin

(10) Patent No.: US 10,128,220 B2
(45) Date of Patent: Nov. 13, 2018

(54) DISPLAY SUBSTRATE, MANUFACTURING METHOD THEREOF, DISPLAY DEVICE

(71) Applicant: BOE TECHNOLOGY GROUP CO., LTD., Beijing (CN)

(72) Inventor: Guangkui Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/535,929

(22) PCT Filed: Jun. 3, 2016

(86) PCT No.: PCT/CN2016/084708
§ 371 (c)(1),
(2) Date: Jun. 14, 2017

(87) PCT Pub. No.: WO2017/148033
PCT Pub. Date: Sep. 8, 2017

(65) Prior Publication Data
US 2018/0082984 A1    Mar. 22, 2018

(30) Foreign Application Priority Data
Mar. 3, 2016  (CN) .......................... 2016 1 0121988

(51) Int. Cl.
*H01L 25/075*    (2006.01)
*H01L 33/62*    (2010.01)
(Continued)

(52) U.S. Cl.
CPC .......... *H01L 25/0753* (2013.01); *H01L 33/62* (2013.01); *H01L 21/6835* (2013.01);
(Continued)

(58) Field of Classification Search
CPC ..... H01L 2933/0066; H01L 2933/0058; H01L 2933/0083; H01L 2221/68368;
(Continued)

(56) References Cited

U.S. PATENT DOCUMENTS 8,685,774 B2    4/2014  Crowder et al.
2002/0185965 A1*  12/2002  Collins, III ........... H01L 33/505
                                                  313/501
(Continued)

FOREIGN PATENT DOCUMENTS

CN       101554794 A    10/2009
CN       101572259 A    11/2009
(Continued)

OTHER PUBLICATIONS

Search Report for International Patent Application No. PCT/CN2016/084708 dated Nov. 30, 2016.
(Continued)

*Primary Examiner* — Yosef Gebreyesus
(74) *Attorney, Agent, or Firm* — Calfee, Halter & Griswold LLP

(57) ABSTRACT

The present disclosure relates to a display substrate, a manufacturing method thereof, and a display device. The method of manufacturing a display substrate includes assembling LED microparticles of each color category onto a printing template corresponding to a respective color category; the surface of the printing template being provided with assembling grooves arranged in such a manner that sub-pixels of a corresponding color category are arranged; transferring the LED microparticles on each printing template onto a same base substrate respectively to form on the base substrate an array of LED microparticles arranged in a same manner as the sub-pixels.

20 Claims, 4 Drawing Sheets

(51) Int. Cl.
　　*H01L 25/16*　　　　(2006.01)
　　*H01L 21/683*　　　(2006.01)
　　*H01L 27/12*　　　　(2006.01)

(52) U.S. Cl.
　　CPC ........ *H01L 25/167* (2013.01); *H01L 27/1218* (2013.01); *H01L 2221/68368* (2013.01); *H01L 2933/0066* (2013.01)

(58) Field of Classification Search
　　CPC ............. H01L 21/6835; H01L 27/1218; H01L 25/167; H01L 25/0753
　　See application file for complete search history.

(56) References Cited

U.S. PATENT DOCUMENTS

| | | | |
|---|---|---|---|
| 2011/0176328 A1* | 7/2011 | Anandan | G02B 6/0036 362/606 |
| 2013/0134629 A1 | 5/2013 | Chen et al. | |
| 2013/0161584 A1 | 6/2013 | Crowder et al. | |
| 2014/0077158 A1 | 3/2014 | Crowder et al. | |
| 2014/0159066 A1 | 6/2014 | Hu et al. | |
| 2014/0367711 A1* | 12/2014 | Bibl | H01L 24/24 257/89 |
| 2015/0059643 A1 | 3/2015 | Du et al. | |
| 2015/0155445 A1 | 6/2015 | Zhan et al. | |
| 2015/0214430 A1 | 7/2015 | Zhan et al. | |
| 2016/0052247 A1 | 2/2016 | Chuang et al. | |
| 2016/0336304 A1 | 11/2016 | Wu et al. | |

FOREIGN PATENT DOCUMENTS

| | | |
|---|---|---|
| CN | 102496685 A | 6/2012 |
| CN | 102642421 A | 8/2012 |
| CN | 102737555 A | 10/2012 |
| CN | 103129287 A | 6/2013 |
| CN | 103375707 A | 10/2013 |
| CN | 104630703 A | 5/2015 |
| CN | 104742551 A | 7/2015 |
| CN | 105129259 A | 12/2015 |
| CN | 105261635 A | 1/2016 |
| CN | 105346293 A | 2/2016 |
| CN | 105528969 A | 4/2016 |

OTHER PUBLICATIONS

First Office Action for Chinese Patent Application No. 201610121988.6 dated Sep. 7, 2017.
Second Office Action for Chinese Patent Application No. 201610121988.6 dated Mar. 30, 2018.
Third Office Action for Chinese Patent Application No. 201610121988.6 dated Sep. 10, 2018.

* cited by examiner

DISPLAY SUBSTRATE, MANUFACTURING METHOD THEREOF, DISPLAY DEVICE

RELATED APPLICATION

The present application is the U.S. national phase entry of PCT/CN2016/084708, with an international filing date of Jun. 3, 2016, which claims the benefit of Chinese Patent Application No. 201610121988.6, filed on Mar. 3, 2016, the entire disclosure of which is incorporated herein by reference.

FIELD

The present disclosure relates to the field of display technology, and particularly to a display substrate, a manufacturing method thereof, and a display device.

BACKGROUND

Micro-LED technology refers to a technology of integrating an array of high-density light emitting diodes (LED) in a micro-sized area, which can reduce the distance between pixel points from millimeter scale to micrometer scale when applied to the display field. Compared with other micro-display technologies, this type of display device can reduce the volume, weight and cost of the overall system while taking into account other characteristics such as low power consumption, quick response, and the like since they are self light-emitting and have a simple optical system. In the existing Micro-LED display field, common substrate manufacturing approaches are mainly divided into three types: 1) making an LED array-integrated chip on a thin film transistor (TFT) substrate; 2) directly growing LEDs on the TFT substrate; 3) making a TFT on an epitaxial wafer provided with LEDs.

However, regardless of which of the above-mentioned manufacturing approaches is used, there are a lot of technical problems in achieving color display and large-size display. For example, not all the areas in an integrally manufactured LEDs can be energized to emit light. For color display, a gap would be further formed between different colors, which will cause a lot of material waste. For another example, there still exists a technical difficulty in large-size growth of LEDs at present, whereas sub-regional growth or splicing will further increase the complexity of process.

In this regard, although the prior art provides the concept of assembling the LED microparticles formed by cutting onto the TFT substrate to form a monochrome LED screen, it is also impossible to process the LED microparticles of different colors in different ways and to fix the LED microparticles to the positions of corresponding colors accurately. As a result, the accuracy of assembling of LED microparticles cannot be guaranteed in color display, leading to the problems such as high production cost, complicated process, and so on.

SUMMARY

In view of the deficiencies in the prior art, the present disclosure provides a display substrate, a manufacturing method thereof, and a display device, for at least alleviating or eliminating one or more of the problems in the prior art.

A first aspect of the present disclosure provides a method of manufacturing a display substrate including assembling LED microparticles of each color category onto a printing template corresponding to a respective color category, a surface of the printing template being provided with assembling grooves arranged in such a manner that sub-pixels of a corresponding color category are arranged; transferring the LED microparticles on each printing template onto a same base substrate respectively to form on the base substrate an array of LED microparticles arranged in a same manner as the sub-pixels.

In some embodiments, a via hole penetrating the printing template is arranged at a groove bottom of the assembling groove.

In some embodiments, the step of assembling LED microparticles of each color category onto a printing template corresponding to a respective color category comprises applying a negative air pressure from a backside of the printing template to the via hole so that the LED microparticles are adsorbed within the assembling groove.

In some embodiments, the step of transferring the LED microparticles on each printing template onto a same base substrate to form on the base substrate an array of LED microparticles arranged in a same manner as the sub-pixels comprises forming a conductive adhesive on a surface of the base substrate on which the array of LED microparticles is to be formed; aligning any one of the printing templates with the base substrate; releasing the negative air pressure applied to the via hole or applying a positive air pressure from the backside of the printing template to the via hole so that the LED microparticles are attached to the surface of the base substrate.

In some embodiments, the LED microparticle has a profile of a cylinder whose horizontal cross section has an outer diameter larger than the height of the cylinder.

In some embodiments, a bottom surface area of the cylinder is larger than a top surface area of the cylinder, and an inner wall of the assembling groove has a shape that matches the profile of the LED microparticle.

In some embodiments, a positive electrode of the LED microparticle is arranged on a top surface of the cylinder and a negative electrode of the LED microparticle is arranged on a bottom surface of the cylinder.

In some embodiments, the step of transferring the LED microparticles on each printing template onto a same base substrate to form on the base substrate an array of LED microparticles arranged in a same manner as the sub-pixels comprises transferring the LED microparticles on each printing template respectively onto a same flexible substrate; transferring the LED microparticles on the flexible substrate onto the base substrate to form on the base substrate an array of LED microparticles arranged in a same manner as the sub-pixels.

A second aspect of the present disclosure further provides a display substrate formed by any method of manufacturing a display substrate described above.

A third aspect of the present disclosure further provides a display device comprising any display substrate described above.

It can be seen from the above technical solutions that, in the present disclosure the LED microparticles are assembled onto different printing templates according to their color categories, and then formed on a same base substrate through multiple transferring, which avoids the process of large-area growth of colored LED layers while overcoming the problem that it is difficult for the LED microparticles of different colors to be accurately assembled to their respective positions. As a result, the manufacturing process of a color LED display device can be simplified and the cost can be reduced. As compared with the prior art, the present disclosure can achieve dense arrangement of LED microparticles on the base substrate based on the mild requirement on the spacing between LED microparticles during the assembling and transferring process, which reduces the material waste between the regions of different colors. Moreover, the manufacturing process does not limit the manufacturing environment for the LED microparticles, thus it is easy to obtain better device characteristics. In addition, since the printing template is used as a carrier for the LED microparticle assembling process instead of a display substrate, the display substrate can be prevented from structure modification required for assembling, and damages caused by the assembling process to the display substrate can also be reduced.

Of course, any one product or method carrying out embodiments of the present disclosure does not necessarily need to achieve all of the advantages described above.

BRIEF DESCRIPTION OF DRAWINGS

In order to more clearly illustrate the technical solutions in embodiments of the present disclosure or the prior art, the drawings required for description of the embodiments or the prior art will be briefly described below. Apparently, the drawings in the description below are some embodiments of the present disclosure. Other drawings may be further obtained by those ordinarily skilled in the art based on these drawings without spending inventive efforts.

DETAILED DESCRIPTION

To make the objectives, technical solutions and advantages of embodiments of the present disclosure clearer, the technical solutions in the embodiments of the present disclosure will be described clearly and comprehensively below with reference to the drawings in the embodiments of the present disclosure. Apparently, the described embodiments are part of the embodiments of the present disclosure, rather than all of them. All other embodiments obtained by those ordinarily skilled in the art based on the embodiments in the present disclosure without spending inventive efforts fall within the scope of the present disclosure.

Figure 1:
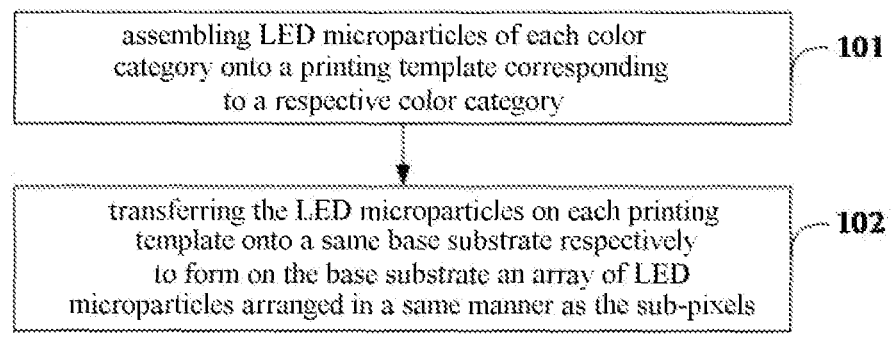
FIG. 1 is a schematic view showing a flow of steps of a method of manufacturing a display substrate according to an embodiment of the present disclosure.

FIG. 1 is a schematic view showing a flow of steps of a method of manufacturing a display substrate according to an embodiment of the present disclosure. Referring to FIG. 1, in step 101, LED microparticles of each color category are assembled onto a printing template corresponding to a respective color category. A surface of the printing template is provided with assembling grooves arranged in such a manner that sub-pixels of corresponding color categories are arranged.

In step 102, the LED microparticles on each printing template are transferred onto a same base substrate respectively to form on the base substrate an array of LED microparticles arranged in the same manner as the sub-pixels.

It is to be noted that the display substrate referred to in embodiments of the present disclosure may be any substrate structure including a light emitting diode (LED) device during the process of forming an LED display device, such as an array substrate and an LED display panel, or any other substrate structure as an intermediate product during the manufacturing process of the LED display device. However, the above base substrate refers to a substrate structure of an intermediate state on which the LED device is about to be formed during the formation process of the display substrate, which may be a substrate structure made of glass or other materials, or a substrate structure on which a device such as a thin film transistor (TFT) has been made, which is not limited in the present disclosure.

It is to be understood that the display substrate in embodiments of the present disclosure is used for forming color display, thus it may have an arrangement structure of sub-pixels of more than one color category, such as RGB (red, green, blue) or RGBW (red, green, blue white), and so on. On such basis, it is possible to obtain in advance LED microparticles of each color category (for example, an LED chip of each color category is manufactured respectively and cut according to the required microparticle size), and a printing template corresponding to each color category. A surface of the printing template is provided with assembling grooves arranged in such a manner that the sub-pixels of corresponding color categories are arranged.

Figure 2:
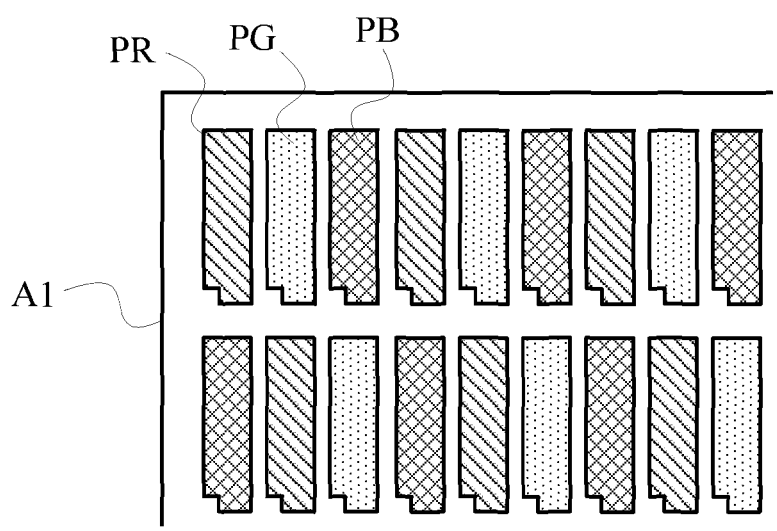
FIG. 2 is a schematic view showing arrangement of sub-pixels on a display substrate according to an embodiment of the present disclosure.
Figure 3A:
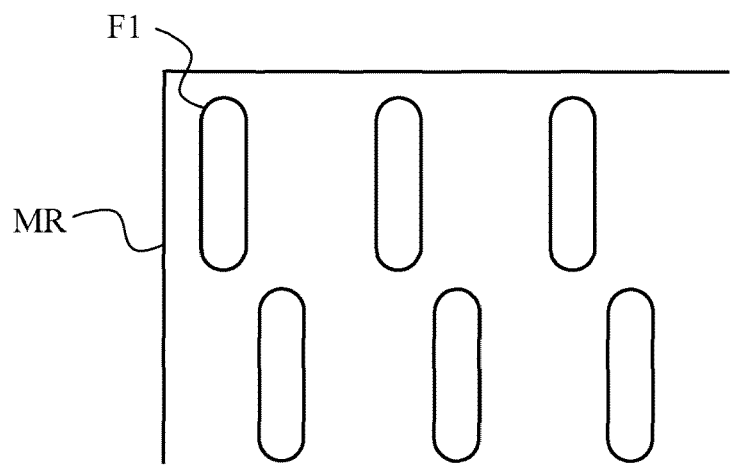
FIGS. 3A, 3B and 3C are schematic views showing the surface structures of three printing templates to which the display substrate shown in FIG. 2 correspond, respectively.
Figure 3B:
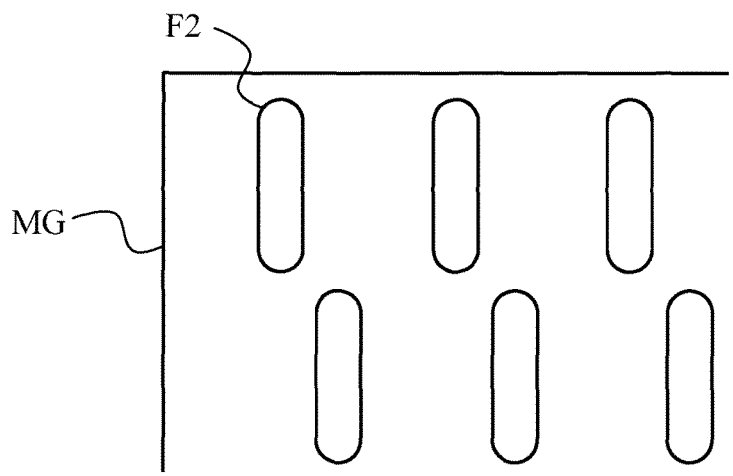
Figure 3C:
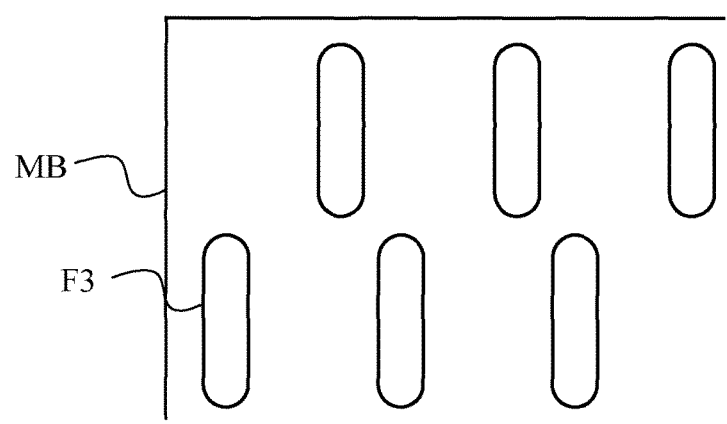
Figure 4:
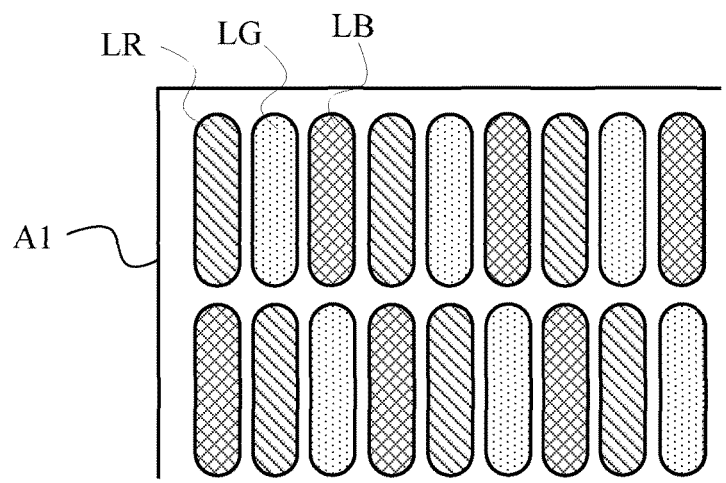
FIG. 4 is a schematic view showing the structure of an array of LED microparticles in the display substrate shown in FIG. 2.

For example, FIG. 2 is a schematic view showing arrangement of sub-pixels on a display substrate according to an embodiment of the present disclosure, and FIGS. 3A, 3B and 3C are schematic views showing surface structures of three printing templates to which the display substrate shown in FIG. 2 corresponds. Referring to FIG. 2, red sub-pixels PR, green sub-pixels PG, and blue sub-pixels PB are arranged alternately in an array in a display area Al of a display panel, wherein the red sub-pixel PR, the green sub-pixel PG and the blue-pixel PB are arranged in turn in each row, and the red sub-pixel PR, the blue sub-pixel PB and the green sub-pixel PG are arranged in turn in each column. In this regard, FIGS. 3A, 3B and 3C show a printing template MR corresponding to red, a printing template MG corresponding to green, and a printing template MB corresponding to blue, respectively, the surfaces of which are provided with assembling grooves F1 arranged in such a manner that the red sub-pixels R are arranged, assembling grooves F2 arranged in such a manner that the green sub-pixels PG are arranged, and assembling grooves F3 arranged in such a manner that the blue sub-pixels PB are arranged, respectively. It is to be noted that the above assembling grooves all match the profile shapes of the LED microparticles under ideal conditions (it may be the case that they completely fit each other in size and shape, or the case that there further remains an additional assembling space in the assembling groove in addition to the assembling space for the LED microparticles) so as to improve the accuracy of assembling of LED microparticles. It is to be understood that the above step 101 specifically comprises: assembling red LED microparticles onto the printing template MR, assembling green LED microparticles onto the printing template MG, and assembling blue LED microparticles onto the printing template MB. Consequently, after the LED microparticles on each printing template are transferred respectively onto a same base substrate, an array of LED microparticles arranged in the same manner as the sub-pixels can be obtained on the base substrate, as shown in FIG. 4. FIG. 4 is a schematic view showing the structure of an array of LED microparticles in the display substrate shown in FIG. 2. Referring to FIG. 4, red LED microparticles LR, green LED microparticles LG, and blue LED microparticles LB are alternately arranged in an array in the display area A1 of the display substrate, wherein the red LED microparticle LR, the green LED microparticle LG and the blue microparticle LB are arranged in turn in each row, and the red LED microparticle LR, the blue LED microparticle LB, and the green LED microparticle LG are arranged in turn in each column. It can be seen from comparison between FIG. 2 and FIG. 4 that the manner in which the LED microparticles are arranged is identical with that in which the sub-pixels in the display substrate are arranged, which is mainly achieved by the arrangement of the assembling grooves on the printing template and the alignment between the printing template and the base substrate during the transferring process.

It can be seen that, in embodiments of the present disclosure, the LED microparticles are assembled onto different printing templates according to their color categories, and then formed on a same base substrate through multiple transferring, which avoids the process of large-area growth of colored LED layers while overcoming the problem that it is difficult for the LED microparticles of different colors to be accurately assembled to their respective positions. As a result, the manufacturing process of a color LED display device can be simplified and the cost can be reduced. As compared with the prior art, embodiments of the present disclosure can achieve dense arrangement of LED microparticles on the base substrate based on the mild requirement on the spacing between LED microparticles during the assembling and transferring process, which reduces the material waste between the regions of different colors. Moreover, the manufacturing process does not limit the manufacturing environment for the LED microparticles, thus it is easy to obtain better device characteristics. In addition, since the printing template is used as a carrier for the LED microparticle assembling process instead of a display substrate, the display substrate can be prevented from structure modification required for assembling, and damages caused by the assembling process to the display substrate can also be reduced. Of course, any specific manner of carrying out embodiments of the present disclosure does not necessarily need to achieve all of the advantages described above.

It is to be noted that the following aspects shown in FIGS. 2, 3A, 3B, 3C and 4 are examples provided for the convenience of explanation. The number and variety of color categories of sub-pixels in a display substrate, the shape and arrangement of sub-pixels, the shape and size of a display area, the shape and size of a printing template, the shape and size of an assembling groove, the shape and size of LED microparticles, etc are not limited in embodiments of the present disclosure. In addition, upon carrying out the present disclosure, as for the aspects that may need to be understood but are not described above, they may be configured by those skilled in the art with reference to the existing theories and literatures, which are not described here for simplicity.

Figure 5:
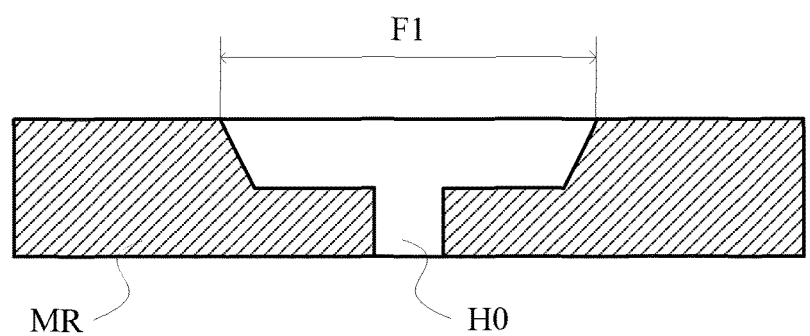
FIG. 5 is a schematic view showing the sectional structure of a printing template according to an embodiment of the present disclosure.
Figure 6:
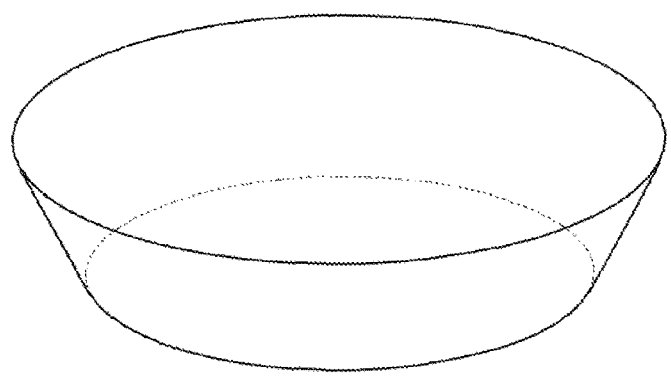
FIG. 6 is a schematic view showing the appearance structure of an LED according to an embodiment of the present disclosure.

As a specific example of the above-described assembling process, FIG. 5 is a schematic view showing a sectional structure of a printing template according to an embodiment of the present disclosure. Referring to FIG. 5, a via hole H0 that penetrates a printing template MR is formed at a groove bottom of an assembling groove F1 formed on the printing template MR. Adaptively, as an example of the shape of an LED microparticle, FIG. 6 is a schematic view showing the appearance structure of an LED according to an embodiment of the present disclosure. Referring to FIG. 6, the profile of the LED microparticle is a cylinder whose horizontal cross section has an outer diameter larger than the height, and the bottom surface area of the cylinder is larger than the top surface area thereof. By comparing FIG. 5 with FIG. 6, it can be seen that the shape of an inner wall of the assembling groove F1 matches the profile of the LED microparticle. It is to be understood that, based on the above shape, a positive electrode and a negative electrode of the LED microparticle are arranged on the top surface and the bottom surface of the cylinder, respectively. On such basis, the assembling process according to embodiments of the present disclosure may be as follows. The above-described step 101 of assembling the LED microparticles of each color category onto a printing template corresponding to a respective color category in embodiments of the present disclosure may specifically comprise: applying a negative air pressure to the via hole from a backside of the printing template so that the LED microparticles are adsorbed in the assembling groove. For example, for the assembling substrate MR shown in FIG. 5, the LED microparticles may be first pre-arranged with their top surfaces facing upwardly and their bottom surfaces facing downwardly on a front surface of the assembling substrate MR where the assembling groove is formed, and a negative air pressure is applied to the via hole H0 to firmly adsorb the LED microparticle within the assembling groove. However, as for the LED microparticles that cannot be assembled within the assembling groove, they can be removed by airflow purging performed on the assembling substrate MR. It can be seen that, based on the design that the bottom surface area of the cylinder is larger than the top surface area thereof, embodiments of the present disclosure can ensure that the top surfaces of all the successfully assembled LED microparticles face upwardly, avoiding occurrence of electrode reversal. Moreover, based on the design that the horizontal cross section of the cylinder has an outer diameter larger than the height of the cylinder, the top surface and the bottom surface of the LED microparticle can be subjected to a stronger air pressure, reducing occurrence of the situation that a side surface is adsorbed and fixed to the via hole. In addition, based on the air pressure-adsorbing assembling process, embodiments of the present disclosure can greatly improve the assembling speed while ensuring the accuracy of assembling.

Figure 7:
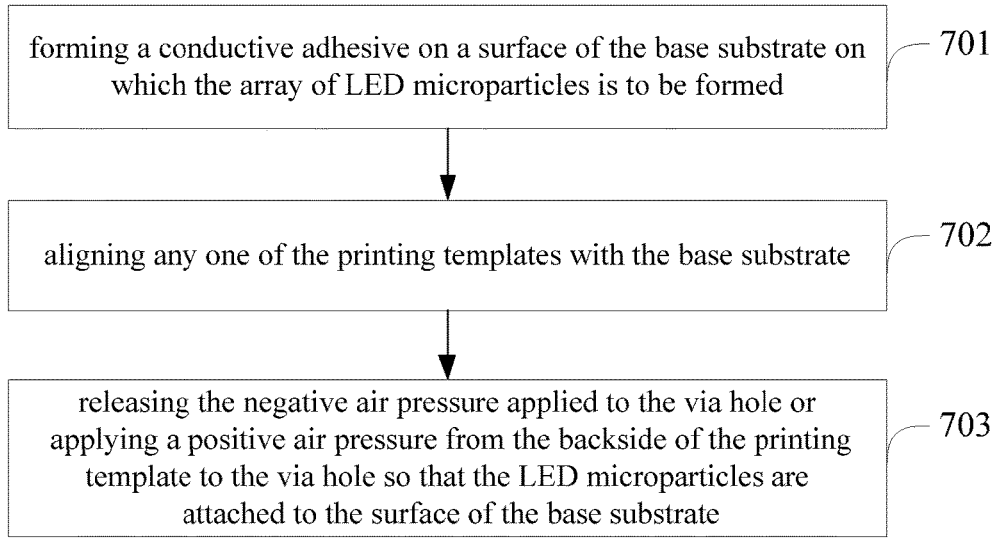
FIG. 7 is a schematic view showing a flow of steps of a transferring process according to an embodiment of the present disclosure.

After the assembling is completed, the above-described step 102 of transferring the LED microparticles on each printing template onto a same base substrate to form on the base substrate an array of LED microparticles arranged in the same manner as the sub-pixels may specifically comprise the following steps as shown in FIG. 7.

In step 701, a conductive adhesive is formed on a surface of the base substrate on which the array of LED microparticles is to be formed.

In step 702, any of the printing templates is aligned with the base substrate.

In step 703, the negative air pressure applied to the via hole is released, or a positive air pressure is applied from a backside of the printing template to the via hole so that the LED microparticles are attached to the surface of the base substrate.

For example, the step 701 described above may specifically comprise a process of coating a conductive adhesive inside the region where each LED microparticle is arranged (when the surface of the base substrate on which the array of LED microparticles is to be formed is an entire conductive electrode, the conductive adhesive can also be coated on the entire surface). The step 702 described above may comprise arranging a front surface of the printing template MR opposite to the surface of the base substrate on which the array of LED microparticles is to be formed in a state where the negative air pressure is maintained in the via hole H0, and performing alignment using alignment marks pre-arranged on the printing template and the base substrate. In the above step 703, embodiments of the present disclosure enable the LED microparticles to drop (or to be pushed) onto the conductive adhesive of the base substrate by releasing the negative air pressure or applying the positive air pressure, and then enable the LED microparticles to be relatively fixed to the base substrate by applying an appropriate pressure on the entire surface. Consequently, by repeating this process for the printing template of each color category, an array of LED microparticles arranged in the same manner as the sub-pixels can be formed on the base substrate.

It can be seen that, based on adsorption under the negative air pressure and release under the positive air pressure (or releasing the negative air pressure), embodiments of the present disclosure can achieve rapid large-area transferring of LED microparticles without losing the LED microparticles. Moreover, it can be understood that, based on the via hole H0 penetrating the printing template MR arranged at the groove bottom of the assembling groove F1, embodiments of the present disclosure can control the fixing relationship between the LED microparticles and the assembling grooves by applying and releasing the air pressure, which facilitates improvement of the alignment accuracy of the LED microparticles and the process efficiency.

It is to be noted that the shape of the assembling groove and the profile of the LED microparticle shown in FIGS. 5 and 6 are only one example. The horizontal cross section of the cylinder of the LED microparticle may further be any other shape (for example, a strip-like shape that can adapt to the shape of the sub-pixels as shown in FIG. 2) such to as a square, a rectangle, a triangle, an ellipse, or the like in addition to a circle. The shapes and areas of the bottom surface and the top surface of the LED microparticle can also be adjusted according to the application requirements. The LED microparticles may even have other profiles in addition to the cylinder due to the limitation of the LED microparticle manufacturing process. In addition, the number, shape, size and arrangement position of the via hole that penetrates the printing template may be different from those shown in the drawings, which are not limited in the present disclosure.

Figure 8:
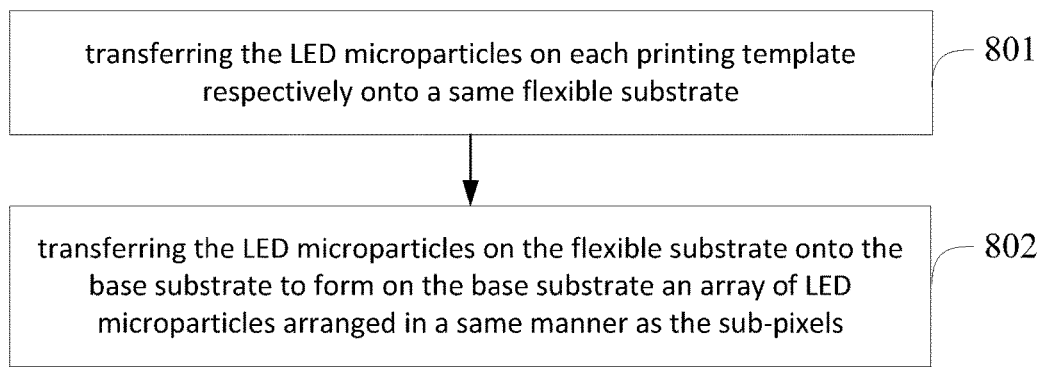
FIG. 8 is a schematic view showing a flow of steps of a transferring process according to another embodiment of the present disclosure.

As an example of another transferring process, FIG. 8 is a schematic view showing a flow of steps of a transferring process according to another embodiment of the present disclosure. Referring to FIG. 8, the above-described step 102 of transferring the LED microparticles on each printing template respectively onto a same base substrate to form on the base substrate an array of LED microparticles arranged in the same manner as the sub-pixels may specifically comprise the following steps.

In step 801, the LED microparticles on each printing templates are transferred onto a same flexible substrate, respectively.

In step 802, the LED microparticles on the flexible substrate are transferred onto the base substrate to form on the base substrate an array of LED microparticles arranged in the same manner as the sub-pixels.

Specifically, in the above LED microparticle transferring process, the LED microparticles may be not directly transferred onto the base substrate from the printing template, but are first transferred onto a flexible substrate and then transferred onto the base substrate. Accordingly, in embodiments of the present disclosure, the LED microparticles can be pre-treated (such as stretching the spacing, bending the surface, etc) to a certain degree based on the characteristics of the material of the flexible substrate so as to accommodate to the requirements of a variety of different transferring modes.

Based on the same inventive concept, embodiments of the present disclosure provide a display substrate which is formed by any method of manufacturing a display substrate as described above. It is to be noted that the display substrate referred to in embodiments of the present disclosure may be any substrate structure including a light emitting diode (LED) display device, such as an array substrate and an LED display panel, during the process of forming the LED display device, or any other substrate structure as an intermediate product during the manufacturing process of the LED display device.

It can be seen that, in embodiments of the present disclosure, the LED microparticles are assembled onto different printing templates according to their color categories, and then formed on a same base substrate through multiple transferring, which avoids the process of large-area growth of colored LED layers while overcoming the problem that it is difficult for the LED microparticles of different colors to be accurately assembled to their respective positions. As a result, the manufacturing process of a color LED display device can be simplified and the cost can be reduced. As compared with the prior art, embodiments of the present disclosure can achieve dense arrangement of LED microparticles on the base substrate based on the mild requirement on the spacing between LED microparticles during the assembling and transferring process, which reduces the material waste between the regions of different colors. Moreover, the manufacturing process does not limit the manufacturing environment for the LED microparticles, thus it is easy to obtain better device characteristics. In addition, since the printing template is used as a carrier for the LED microparticle assembling process instead of a display substrate, the display substrate can be prevented from structure modification required for assembling, and damages caused by the assembling process to the display substrate can also be reduced. Of course, any specific manner of carrying out embodiments of the present disclosure does not necessarily need to achieve all of the advantages described above.

Based on the same inventive concept, embodiments of the present disclosure provide a display device comprising any display substrate described above. It is to be noted that the display device in the present embodiment may be any product or component having display function, such as a display panel, an electronic paper, a mobile phone, a tablet computer, a television set, a notebook computer, a digital photo frame, a navigator, or the like. Since the display device according to embodiments of the present disclosure comprises any display substrate described above, the manufacturing process of a color LED display device can also be simplified, the cost can be reduced, and corresponding beneficial effects can be achieved, which are not described here for simplicity.

It is to be noted that, in this context, relational terms such as first and second are used only to distinguish an entity or an operation from another entity or operation without necessarily requiring or implying that these entities or operations have any such actual relationship or sequence. Moreover, the term "comprise", "include", or any other variant is intended to encompass a non-exclusive inclusion such that processes, methods, articles or devices that include a series of elements include not only those elements but also those that are not explicitly listed, or other elements that are inherent to such processes, methods, articles or devices. In the absence of more restrictions, the elements defined by the statement "including a . . . " do not preclude the presence of additional elements in the process, method, article, or device that includes the elements. The orientation or positional relationships indicated by the terms "up", "down", etc are based on the orientation or positional relationships shown in the drawings, only for the purpose of facilitating description of the present disclosure and simplification of the description, rather not indicating or implying that the indicated means or element must have a specific orientation or must be constructed and operated in a particular orientation, which cannot be construed as limiting the present disclosure. Unless explicitly specified and defined otherwise, the term "install", "link" or "connect" should be understood in a broad sense, for example, it may be a fixed connection, a detachable connection, or an integral connection; it may be a mechanical connection or an electrical connection; it may be a direct linking or a linking via an intermediate medium; it may be a communication between two elements. For those ordinarily skilled in the art, the specific meanings of the above terms in the present disclosure can be understood based on specific situations.

A number of specific details are set forth in the specification of the present disclosure. It is to be understood, however, that the embodiments of the present disclosure can be practiced without these specific details. In some instances, well-known methods, structures, and techniques have not been shown in detail so as not to obscure the understanding of this specification. Similarly, it is to be understood that the features of the present disclosure are sometimes grouped together into a single embodiment, figure or description thereof in the exemplary embodiments of the present disclosure in order to simplify the disclosure of the present disclosure and to assist in understanding one or more of the various disclosed aspects.

Finally, it is to be noted that the above embodiments are merely illustrative of the technical solutions of the present disclosure and are not intended to be limiting. While the present disclosure has been described in detail with reference to the foregoing embodiments, those ordinarily skilled in the art should understand that it is still possible to modify the technical solutions recited in the foregoing embodiments or to make equivalent substitution for some or all of the technical features therein, and that such modifications or substitutions do not cause the essence of the corresponding technical solutions to depart from the scope of the technical solutions of the embodiments of the present disclosure, all of which should be encompassed within the scope of the specification of the present disclosure.

The invention claimed is:

1. A method of manufacturing a display substrate comprising:

assembling LED microparticles of each color category onto a printing template corresponding to a respective color category, a surface of the printing template being provided with assembling grooves arranged in a same manner that sub-pixels of a corresponding color category are arranged;

transferring the LED microparticles on each printing template onto a corresponding base substrate to form on the base substrate an array of LED microparticles arranged in the same manner that sub-pixels are arranged.

2. The method of manufacturing the display substrate according to claim 1, wherein a via hole penetrating the printing template is arranged at a groove bottom of the assembling groove.

3. The method of manufacturing the display substrate according to claim 2, wherein the step of assembling LED microparticles-comprises applying a negative air pressure from a backside of the printing template to the via hole so that the LED microparticles are adsorbed within the assembling groove.

4. The method of manufacturing the display substrate according to claim 3, wherein the step of transferring the LED microparticles comprises forming a conductive adhesive on a surface of the base substrate on which the array of LED microparticles is to be formed;

aligning any one of the printing templates with the base substrate;

releasing the negative air pressure applied to the via hole so that the LED microparticles are attached to the surface of the base substrate.

5. The method of manufacturing the display substrate according to claim 2, wherein the step of transferring the LED microparticles comprises forming a conductive adhesive on a surface of the base substrate on which the array of LED microparticles is to be formed;

aligning any one of the printing templates with the base substrate;

applying a positive air pressure from the backside of the printing template to the via hole so that the LED microparticles are attached to the surface of the base substrate.

6. The method of manufacturing the display substrate according to claim 1, wherein the LED microparticle has a profile of a cylinder whose horizontal cross section has an outer diameter larger than a height of the cylinder.

7. The method of manufacturing the display substrate according to claim 6, wherein a bottom surface area of the cylinder is larger than a top surface area of the cylinder, and an inner wall of the assembling groove has a shape that matches the profile of the LED microparticle.

8. The method of manufacturing the display substrate according to claim 6, wherein a positive electrode of the LED microparticle is arranged on a top surface of the cylinder and a negative electrode of the LED microparticle is arranged on a bottom surface of the cylinder.

9. The method of manufacturing the display substrate according to claim 1, wherein the step of transferring the LED microparticles comprises transferring the LED microparticles on the printing template onto a corresponding flexible substrate;

transferring the LED microparticles on the flexible substrate onto the base substrate to form on the base substrate an array of LED microparticles arranged in a same manner as the sub-pixels.

10. A display substrate formed by the method of manufacturing the display substrate according to claim 1.

11. A display device comprising the display substrate according to claim 10.

12. The display according to claim 11, wherein a via hole penetrating the printing template is arranged at a groove bottom of the assembling groove.

13. The display substrate according to claim 10, wherein a via hole penetrating the printing template is arranged at a groove bottom of the assembling groove.

14. The display substrate according to claim 13, wherein the step of assembling LED microparticles comprises applying a negative air pressure from a backside of the printing template to the via hole so that the LED microparticles are adsorbed within the assembling groove.

15. The display substrate according to claim 14, wherein the step of transferring the LED microparticles comprises:

forming a conductive adhesive on a surface of the base substrate on which the array of LED microparticles is to be formed;

aligning any one of the printing templates with the base substrate;

releasing the negative air pressure applied to the via hole so that the LED microparticles are attached to the surface of the base substrate.

16. The display substrate according to claim 13, wherein the step of transferring the LED microparticles comprises forming a conductive adhesive on a surface of the base substrate on which the array of LED microparticles are to be formed;

aligning any one of the printing templates with the base substrate;

applying a positive air pressure from the backside of the printing template to the via hole so that the LED microparticles are attached to the surface of the base substrate.

17. The display substrate according to claim 10, wherein the LED microparticle has a profile of a cylinder whose horizontal cross section has an outer diameter larger than a height of the cylinder.

18. The display substrate according to claim 17, wherein a bottom surface area of the cylinder is larger than a top surface area of the cylinder, and an inner wall of the assembling groove has a shape that matches the profile of the LED microparticle.

19. The display substrate according to claim 17, wherein a positive electrode of the LED microparticle is arranged on a top surface of the cylinder and a negative electrode of the LED microparticle is arranged a bottom surface of the cylinder.

20. The display substrate according to claim 10, wherein the step of transferring the LED microparticles comprises transferring the LED microparticles on each printing template onto a corresponding flexible substrate;

transferring the LED microparticles on the flexible substrate onto the base substrate to form on the base substrate an array of LED microparticles arranged in a same manner as the sub-pixels.

\* \* \* \* \*